United States Patent
Shi

(10) Patent No.: US 10,401,543 B1
(45) Date of Patent: Sep. 3, 2019

(54) TYPE-II HYBRID ABSORBER PHOTODETECTOR

(71) Applicant: National Central University, Taoyuan (TW)

(72) Inventor: Jin-Wei Shi, Taoyuan (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 16/121,758

(22) Filed: Sep. 5, 2018

(51) Int. Cl.
*G02B 5/22* (2006.01)
*H01L 31/167* (2006.01)
*H01L 31/0352* (2006.01)
*H01L 31/0304* (2006.01)
*H01L 31/0232* (2014.01)

(52) U.S. Cl.
CPC .......... *G02B 5/22* (2013.01); *H01L 31/02327* (2013.01); *H01L 31/03046* (2013.01); *H01L 31/035236* (2013.01); *H01L 31/167* (2013.01)

(58) Field of Classification Search
CPC ............... G02B 5/22; H01L 31/02327; H01L 31/03046; H01L 31/167; H01L 31/035236
See application file for complete search history.

(56) References Cited

U.S. PATENT DOCUMENTS

| | | | | |
|---|---|---|---|---|
| 2010/0072457 | A1* | 3/2010 | Iguchi | B82Y 20/00 257/21 |
| 2012/0196398 | A1* | 8/2012 | Akita | B82Y 20/00 438/80 |

OTHER PUBLICATIONS

Yu-Wen Wang, National Central University Institutional Repository Item 987654321/74886.
Keming Liang, "Engineering cofactor flexibility enhanced 2,3-butanediol production in *Escherichia coli*" J Ind Microbiol Biotechnol (2017) 44:1605-1612.

* cited by examiner

*Primary Examiner* — Mohammed R Alam
(74) *Attorney, Agent, or Firm* — Jackson IPG PLLC; Demian K. Jackson

(57) ABSTRACT

A type-II hybrid absorber photodetector (PD) is provided with ultrafast speed and high-power performance at terahertz (THz) regime. Through narrowed bandgap and enhanced absorption process at a type-II interface between absorption layers of gallium arsenic antimonide ($GaAs_{0.5}Sb_{0.5}$) and indium gallium arsenide ($In_{0.53}Ga_{0.47}As$), the incorporation of the type-II $P^+$-$GaAs_{0.5}Sb_{0.5}$/i-$In_{0.53}Ga_{0.47}As$ hybrid absorber in an indium phosphide (InP) UTC-PD obtains improvement in responsivity. Current blocking effect is minimized owing to the high-excess energy of photo-generated electrons injected from the $GaAs_{0.5}Sb_{0.5}$ layer to an InP-based collector layer. The flip-chip bonding packaged device shows a moderate responsivity along with a record wide optical-to-electrical bandwidth at 0.33 THz, among all the reported for long-wavelength ultrafast PDs. A saturation current exceeding 13 mA and a continuous-wave output power of −3 decibel-milliwatts are demonstrated at an operating frequency of 0.32 THz under an optical signal with a sinusoidal wave and a ~63% modulation depth for PD excitation.

12 Claims, 7 Drawing Sheets

TYPE-II HYBRID ABSORBER PHOTODETECTOR

TECHNICAL FIELD OF THE INVENTION

The present invention relates to an absorber photodetector (PD); more particularly, to using type-II P-type partial depletion absorber in PD, where a type-II heterostructure of P-type gallium arsenic antimonide and intrinsic indium gallium arsenide ($P^+$-$GaAs_{0.5}Sb_{0.5}$/i-$In_{0.53}Ga_{0.47}As$) obtains a narrow bandgap for effectively improve inner absorption process and responsivity performance.

DESCRIPTION OF THE RELATED ARTS

Conventional P-I-N PD has an intrinsic region inserted between $P^+$ region and $N^+$ region to be used as an absorption layer. The width of the intrinsic region is much bigger than the depletion-charge region of a PN junction. Supposing bias is applied to the both sides of the diode, the depletion region would mainly extend toward the side having a lower concentration. Therefore, owing to the very low concentration of free carriers in the intrinsic region, the depletion-charge region will be completely extended to the entire intrinsic region under a very low reverse bias applied to the P-I-N PD. On designing the conventional P-I-N PD, there are great trade-offs for power and bandwidth. In order to obtain a high speed for the PD, the intrinsic region must be made thin in the structure on designing. However, for the consideration of high responsivity or quantum efficiency, it is necessary to thicken the intrinsic region. Yet, responsivity and bandwidth are both standards for differing good PDs from bad ones. Hence, it is an unavoidable serious design contradiction on designing the conventional P-I-N PDs.

Since the P-I-N PD has no inner optical gain, the maximum inner optical gain is 100%. Besides, the speed performance of the conventional P-I-N PD is mainly limited by transit time effect and circuit parameters. The transit time in the depletion region is determined by the width of the intrinsic region and the transit speed of carriers. In the intrinsic region, the carriers are transited at a drift velocity. Therefore, the transit time of the carriers is essentially determined by the width of the intrinsic region. In the $P^+$ and $N^+$ regions, the carriers are transited through diffusing. Because diffusing is much slower than drifting, the transit time often results in a reduction in response speed for the conventional P-I-N PD. Another factor affecting the bandwidth is circuit parameters, which in term is the capacitors of the P-I-N PD. This factor can be overcome through size reduction. Except the above drawbacks, the most serious problem existed in the conventional P-I-N PD is the following: Under an operation of high luminous-power irradiation, the conventional P-I-N PD will deteriorate in speed performance and its electric power output does not increase. It is because the applied electric field is shielded by the space electric field sensed by the inner photoexcited carriers.

As is well known, conventional P-I-N absorption layer is designed to be disposed inside the intrinsic region for light absorption. The intrinsic region will generate electron-hole pairs after light absorption. Because of the electric field, holes will drift to the $P^+$ region and the electrons to the $N^+$ region. But hole is far slower than electron. Holes will tend to be accumulated in the intrinsic region to form electric-field shielding effect. The internal electric field becomes small with slow carrier discharging speed and affects output power. From the following formula, it is known that the maximum output current has a direct-ratio relationship to the carrier speed. The feature performance of the P-I-N PD have to consider the hole speed for its being slow.

$$J_{Max} \cong \frac{(V_{bias} + \varphi)\varepsilon V_{carrier}}{D^2}$$

The intrinsic layer of a uni-traveling-carrier photodiode (UTC-PD) comprises a P-type narrow-band absorption layer and an undoped (or N-type lightly doped) wide-band collector layer. After the P-type doped region absorbs light, electron-hole pairs are generated. Because holes are multiple carriers in the P-type doped region, they can be quickly extended to the contact metal. Hence, in UTC-PD, electron is the only operation charge. Besides, the delay time of UTC-PD is determined by the transit time of electrons. This is very different from the conventional P-I-N PD where both electron and hole are operation charge. From the above formula, it is known that, because the carrier speed is dominated by electron as obviously different from the P-I-N device dominated by hole, UTC-PD will have a greater maximum output current than the conventional P-I-N device. Furthermore, the space charge shielding effect formed by UTC-PD is obviously different from that of the conventional P-I-N device.

The feature performance of UTC-PD determined by electron fully demonstrates the feature of electron as faster than hole. This basic feature of electron makes UTC-PD achieve amazing response speed. Super high output saturated current and high speed are both accomplished. On designing a UTC-PD, the existence of a P-type absorption layer makes the thickness consideration of the P-type absorption layer and the intrinsic layer be separated individually for good performance on both bandwidth and responsivity. The consideration for the conflict between bandwidth and responsivity on designing the conventional P-I-N PD is eliminated, where the absorption region of the conventional P-I-N PD is transferred from the intrinsic layer to a P-type doped layer and the original intrinsic layer is replaced with a non-absorbing indium phosphide (InP) material. This restructuring conquers the space electric-field shielding effect and eases the saturation in the conventional P-I-N structure owing to hole accumulation. Moreover, the UTC-PD thus obtains an outstanding 3-decibel bandwidth as well as an output saturated current. However, some problems still exist in practical use. The UTC-PD needs to be operated under a low bias to achieve ballistic transport. But, under the low-bias operation, external load-resistance effect will dominate the power performance. When high power is generated, a large amount of photocurrent will flow through load resistance and an electric field having an opposite bias polarity will be formed. Therefore, for acquiring high power performance, the UTC-PD is generally operated under a higher bias, which surely sacrifices the drift velocity of carriers.

In addition, when the UTC-PD is operated at a very high power, the effect of current blocking happens in the original undoped layer. Electrons begin to be accumulated at band edge, where saturation and speed drop happen. Hence, to solve this problem, the most direct method is to add N-type doping for improving power performance. Yet, breakdown voltage is sacrificed. As a result, the breakdown voltage and the output power are conflicted in design on doping this layer. Hence, the prior arts do not fulfill all users' requests on actual use.

SUMMARY OF THE INVENTION

The main purpose of the present invention is to form a hybrid absorption layer of $P^+$-$GaAs_{0.5}Sb_{0.5}$/i-$In_{0.53}Ga_{0.47}As$ having a type-II band alignment in a uni-traveling-carrier photodiode (UTC-PD), where, together with enhanced process of light absorption, responsivity is improved by the type-II interface with a narrow bandgap between the first absorption layer of $In_{0.53}Ga_{0.47}As$ and the second absorption layer of $GaAs_{0.5}Sb_{0.5}$.

Another purpose of the present invention is to minimize current blocking effect by the high-excess energy of the photo-generated electrons injected from the $GaAs_{0.5}Sb_{0.5}$ layer to an indium phosphide (InP)-based collector layer.

Another purpose of the present invention is to obtain a moderate responsivity (0.11 amperes per watt (A/W)) along with a record wide 3 dB O-E bandwidth at 0.33 terahertz (THz) through a flip-chip bonding packaged device having an active diameter of 3 µm, among all the reported for long wavelength (1.3~1.55 µm) ultrafast PDs.

Another purpose of the present invention is to successfully achieve a saturation current exceeding 13 mA and a continuous wave (CW) output power as high as −3 decibel-milliwatts (dBm) at an operation frequency of 0.32 THz under an optical signal having a sinusoidal wave and a ~63% modulation depth for PD excitation.

To achieve the above purposes, the present invention is a device of type-II hybrid absorber PD, comprising an N-type contact layer, a collector layer, a graded layer, a first absorption layer, a second absorption layer, an electron blocking layer and a P-type graded field contact layer, where the N-type contact layer is a first semiconductor N+-type doped; the collector layer is a second semiconductor undoped and disposed on the N-type contact layer; the graded layer is a third semiconductor N-type doped and disposed on the collector layer; the first absorption layer is a fourth semiconductor undoped and disposed on the graded layer; the second absorption layer is a fifth semiconductor $P^+$-type doped and disposed on the first absorption layer; an interface with a narrow bandgap between the second absorption layer and the first absorption layer is formed; the electron blocking layer is a sixth semiconductor $P^+$-type doped and disposed on the second absorption layer; the P-type graded field contact layer is a seventh semiconductor $P^+$-type doped and disposed on the electron blocking layer; the device is an epitaxial device; wherein the second absorption layer is a $P^+$-type absorption layer of gallium arsenic antimonide (GaAsSb) ($P^+$-$GaAs_{0.5}Sb_{0.5}$) is graded doped and has a thickness of 90±2 nanometers (nm); wherein the first absorption layer is an intrinsic absorption layer of indium gallium arsenide (InGaAs) (i-$In_{0.53}Ga_{0.47}As$) is undoped and has a thickness of 70±2 nm; a hybrid absorption layer of $P^+$-$GaAs_{0.5}Sb_{0.5}$/i-$In_{0.53}Ga_{0.47}As$ having a type-II band alignment are thus obtained in a uni-traveling-carrier photodiode (UTC-PD); and, together with enhanced process of light absorption, responsivity is improved by the type-II interface with the narrow bandgap between the first absorption layer of $In_{0.53}Ga_{0.47}As$ and the second absorption layer of $GaAs_{0.5}Sb_{0.5}$. Accordingly, a novel device of type-II hybrid absorber PD is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1A:
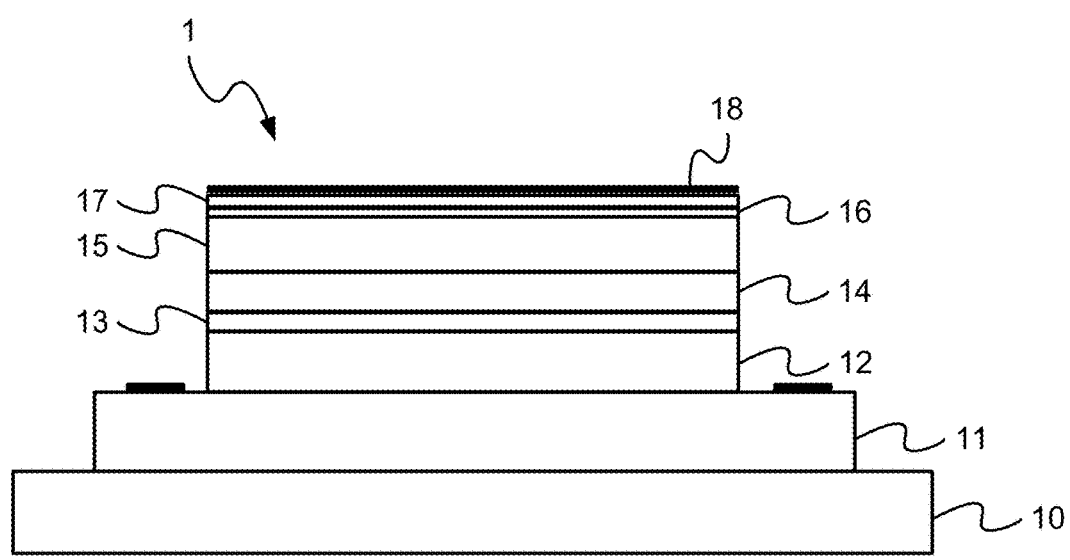
FIG. 1A is the cross-sectional view showing the preferred embodiment according to the present invention.

The following description of the preferred embodiment is provided to understand the features and the structures of the present invention.

Please refer to FIG. 1A to FIG. 6, which are a sectional view showing a preferred embodiment according to the present invention; a view showing energy levels of the present invention; views showing measured bias-dependent O-E frequency responses under different output photocurrents for PDs with active diameters of 3 µm, 5 µm and 8 µm, separately; a view showing extracted resistance-capacitance (RC) bandwidth; and a view showing measured photo-generated MMW powers under different reverse biases for the PD with the 3 µm active diameter. As shown in the figures, the present invention is an epitaxial device 1 of type-II hybrid absorber PD, comprising an N-type contact layer 11, a collector layer 12, a graded layer 13, a first absorption layer 14, a second absorption layer 15, an electron blocking layer 16 and a P-type graded field contact layer 17, from bottom to top. Therein, a hybrid absorption layer of P+-$GaAs_{0.5}Sb_{0.5}$/i-$In_{0.53}Ga_{0.47}As$ having a type-II band alignment are thus used in a uni-traveling-carrier photodiode (UTC-PD); and, together with enhanced process of light absorption, responsivity is improved by a type-II interface with a narrow bandgap between the absorption layers of $In_{0.53}Ga_{0.47}As$ and $GaAs_{0.5}Sb_{0.5}$.

The N-type contact layer 11 is a first semiconductor of $N^+$-type doped indium phosphide (InP) to be used as an N-type electrode, where the N-type contact layer 11 has a thickness of 700±20 nanometers (nm).

The collector layer 12 is a second semiconductor of undoped InP being set on the N-type contact layer 11, where the collector layer 12 has a thickness of 100±20 nm.

The graded layer 13 is a third semiconductor of N-type doped indium aluminum gallium arsenide (InAlGaAs) being set on the collector layer 12, where the graded layer 13 has a thickness of 20±2 nm.

The first absorption layer 14 is a fourth semiconductor of undoped indium gallium arsenide (InGaAs) being set on the graded layer 13, where the first absorption layer 14 has a thickness of 70±2 nm.

The second absorption layer 15 is a fifth semiconductor of $P^+$-type doped gallium arsenic antimonide (GaAsSb) being set on the first absorption layer 14 to form an interface with a narrow bandgap between the second absorption layer 15 and the first absorption layer 14, where the second absorption layer 15 has a thickness of 90±2 nm.

The electron blocking layer 16 is a sixth semiconductor of $P^+$-type doped aluminum gallium arsenic antimonide (Al- GaAsSb) being set on the second absorption layer 15, where the electron blocking layer 16 has a thickness of 7±1 nm.

The P-type graded field contact layer 17 is a seventh semiconductor of P$^+$-type doped InGaAs being set on the electron blocking layer 16 to be used as a P-type electrode and the P-type graded field contact layer 17 further comprises a metallic conductive layer 18, where the P-type graded field contact layer 17 has a thickness of 15±2 nm.

The epitaxial device 1 is grown on a semi-insulating semiconductor substrate 10. The semiconductor substrate 10 is a semiconductor of a compound like gallium arsenide (GaAs), gallium antimonide (GaSb), InP or gallium nitride (GaN); or, of an IV-group element like silicon (Si). Thus, a novel device of type-II hybrid absorber PD is obtained.

Therein, the graded layer 13 is N$^-$-type In$_{0.52}$Al$_y$Ga$_{(0.48-y)}$As and y is a value of 0.04~0.25; the first absorption layer 14 is intrinsic In$_{0.53}$Ga$_{0.47}$As (i-In$_{0.53}$Ga$_{0.47}$As), which is undoped; the second absorption layer 15 is P$^+$-type GaAs$_{0.5}$Sb$_{0.5}$ (P$^+$-GaAs$_{0.5}$Sb$_{0.5}$), which is graded doped; the electron blocking layer 16 is P$^+$-type Al$_{0.3}$Ga$_{0.7}$As$_{0.5}$Sb$_{0.5}$; and the P-type graded field contact layer 17 is P$^+$-type doped In$_{0.53}$Ga$_{0.47}$As.

The epitaxial device 1 of type-II hybrid absorber PD according to present invention can use any conventional growth method without limit. Preferred epitaxial methods include molecular beam epitaxy (MBE), metalorganic chemical vapor deposition (MOCVD), hydride vapor phase epitaxy (HVPE), etc. for the growth on the semiconductor substrate 10.

Figure 1B:
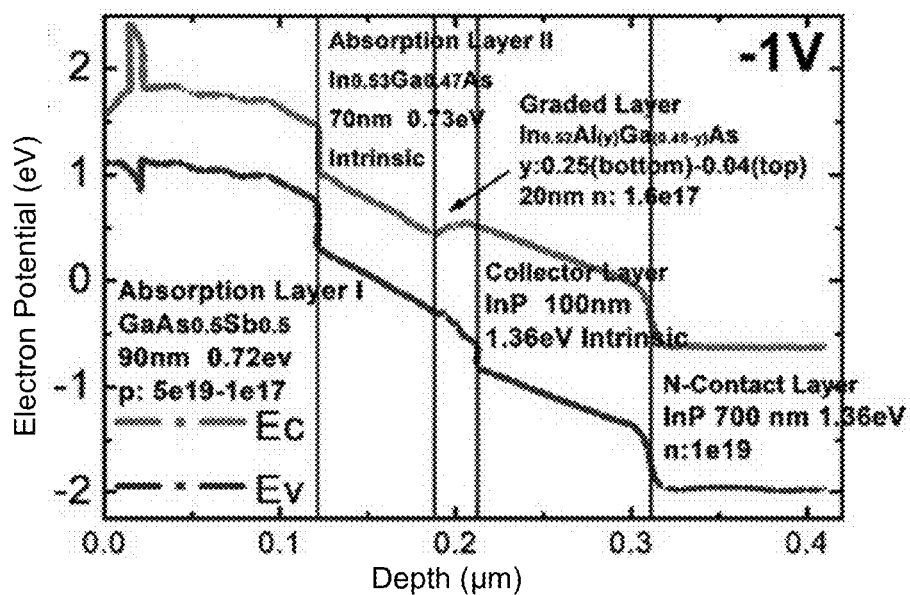
FIG. 1B is the view showing the energy levels of the present invention.

FIG. 1A and FIG. 1B, respectively, show a conceptual cross-sectional view of the device and the simulated band diagram of the hybrid absorption layer of UTC-PD under a bias of −1 volt (V). As is shown, the hybrid absorption region with a type-II band alignment (P$^+$-GaAs$_{0.5}$Sb$_{0.5}$/i-In$_{0.53}$Ga$_{0.47}$As) comprises two major parts. One is the P$^+$-GaAs$_{0.5}$Sb$_{0.5}$ absorption layer 15 with a thickness of 90 nm and a graded doping profile (top: 5×10$^{19}$ cm$^{-3}$ to bottom: 1×10$^{17}$ cm$^{-3}$), which is designed to accelerate electron diffusion process. The other is the i-In$_{0.53}$Ga$_{0.47}$As absorption layer 14 with a thickness of 70 nm, as shown in FIG. 1B. This type of undoped In$_{0.53}$Ga$_{0.47}$As absorption layer 14 is used in the P-type absorber of a traditional UTC-PD to minimize electron recombination process. Although such an intrinsic layer may contribute to undesired hole transport, the corresponding transit time limited bandwidth of hole is still as high as 0.5 terahertz (THz), larger than the measured O-E bandwidth of the device (~0.33 THz).

Furthermore, the type-II band alignment of the interface between the layers of GaAs$_{0.5}$Sb$_{0.5}$ and In$_{0.53}$Ga$_{0.47}$As narrows effective bandgap to 0.5 electron volts (~2.4 μm cut-off wavelength). The collector layer 12 consists of an intrinsic InP (i-InP) layer with an ultra-low background doping density in order to reduce the required bias voltage and device heating under high power operation. A thin (20 nm) N-type graded layer having an In0.52Al$_y$Ga(0.48-y)As (y: 0.04~0.25) graded bandgap structure is inserted between the i-In$_{0.53}$Ga$_{0.47}$As layer and the i-InP layer to obtain a drop in electron potential and further suppression of current blocking effect.

On using the present invention, PDs with three different active diameters of 3 μm, 5 μm and 8 μm (devices A to C) are fabricated.

Figure 2:
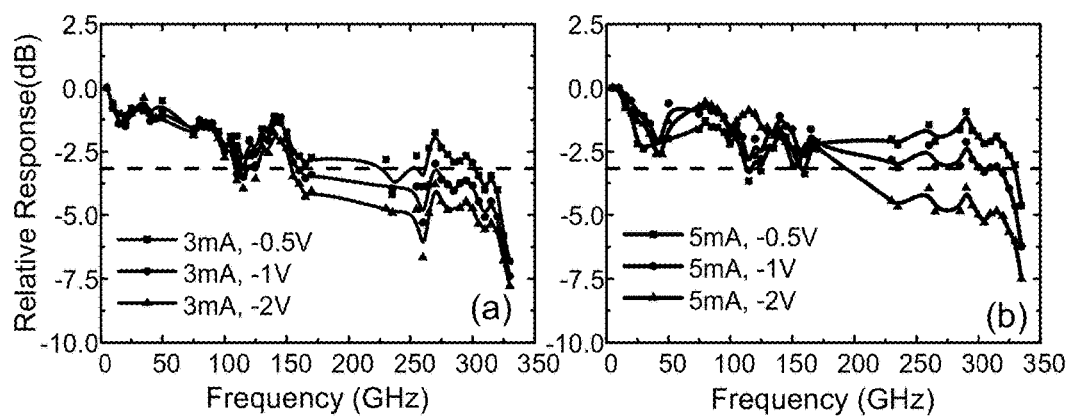
FIG. 2 is the view showing the measured bias-dependent optical-to-electrical (O-E) frequency responses under different output photocurrents for the photodetector (PD) with the 3-micrometer (µm) active diameter.
Figure 3:
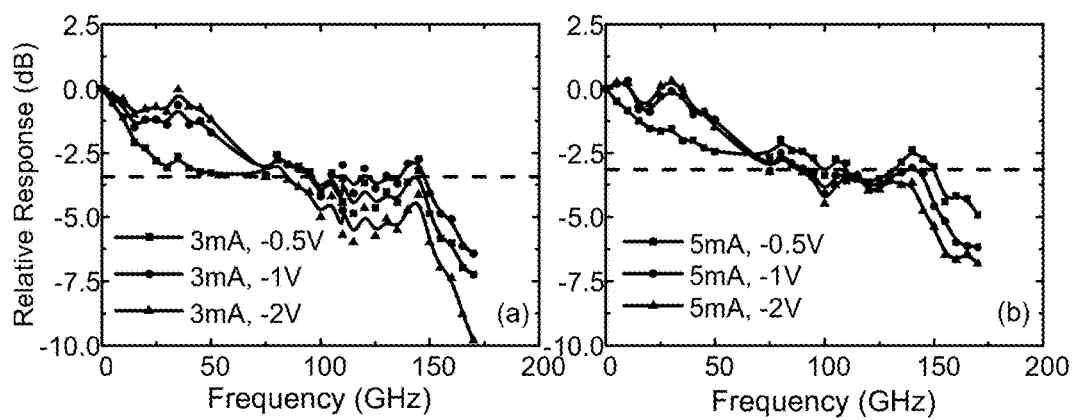
FIG. 3 is the view showing the measured bias-dependent O-E frequency responses under different output photocurrents for the PD with the 5 µm active diameter.
Figure 4:
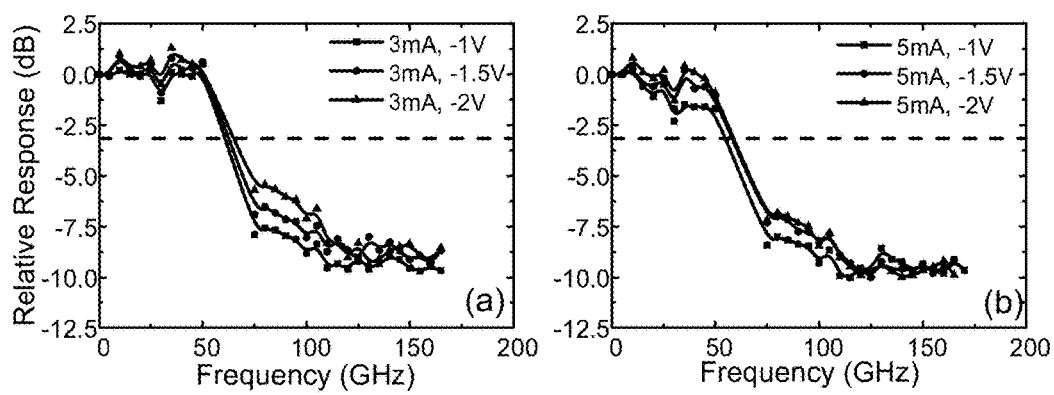
FIG. 4 is the view showing the measured bias-dependent O-E frequency responses under different output photocurrents for the PD with the 8 µm active diameter.

FIG. 2 to FIG. 4 show the measured bias-dependent O-E frequency responses under different output photocurrents at 3 mA and 5 mA for devices A to C, respectively. As shown in FIG. 2, the optimum bias for high-speed performance of the device A with an active diameter of 3 μm happens at −0.5V under output photocurrents of 3 mA and 5 mA. A further increase in reverse bias voltage to −2V results in degradation of the O-E bandwidth, which is attributed to the electron inter-valley scattering effect under a high applied electric field. In addition, under the same reverse bias, a slight bandwidth enhancement is observed when the output photocurrent increases from 3 mA to 5 mA. This phenomenon usually happens in UTC-PDs and is attributed to the self-induced field of photo-generated holes in p-type absorber, which accelerates electron diffusion process and enhances the O-E bandwidth of the PD. As shown in FIG. 2, the maximum 3-decibel (dB) O-E bandwidth reaches 0.33 THz for device A under an output photocurrent of 5 mA, an optimum bias of −0.5V and a load of 50 Ohm. This bandwidth is the highest ever reported for ultrafast PDs for operation at telecommunication wavelengths (1.3~1.55 μm).

The epitaxial device 1 is designed to achieve ultrafast performance with a near THz bandwidth. A thinner depletion layer thickness (~190 nm) is thus adopted to shorten the internal carrier transit time, which in turn results in a small RC-limited bandwidth when the active area is enlarged. As shown in FIG. 3 and FIG. 4, the 3 dB O-E bandwidth has a degradation around 150 GHz and 60 GHz for the devices B and C with active diameters of 3 μm and 8 μm, respectively. In contrast to the device A, when operating at a THz regime (~0.33 THz), the optimum bias for high-speed performance of the device C shifts from −0.5V to −2V. This indicates a gradual enhancement in the RC-limited bandwidth by the increase in the reverse bias voltage due to the widening of depletion region, rather than the measured O-E bandwidth being dominated by internal carrier transit time.

For acquiring the 3 dB O-E bandwidths before measuring the devices A, B and C, a two-port equivalent circuit model is built to extract each of the device's RC-limited bandwidths. The overall O-E 3 dB bandwidth (f3 dB) of a PD is determined by carrier transport time (1/ft) and RC time constant (1/fRC). In order to investigate the internal carrier transport time inside the device, the following Equation 1 is adopted:

$$\frac{1}{f_{3dB}^2} = \frac{1}{f_{RC}^2} + \frac{1}{f_t^2} = (2\pi RC)^2 + \frac{1}{f_t^2}, \quad (1)$$

where R is the sum of parasitic resistance and load resistance (50Ω); and C is total capacitance. Using the extracted RC-limited bandwidths and the measured O-E bandwidths, the internal transit time inside the device is thus obtained.

Figure 5:
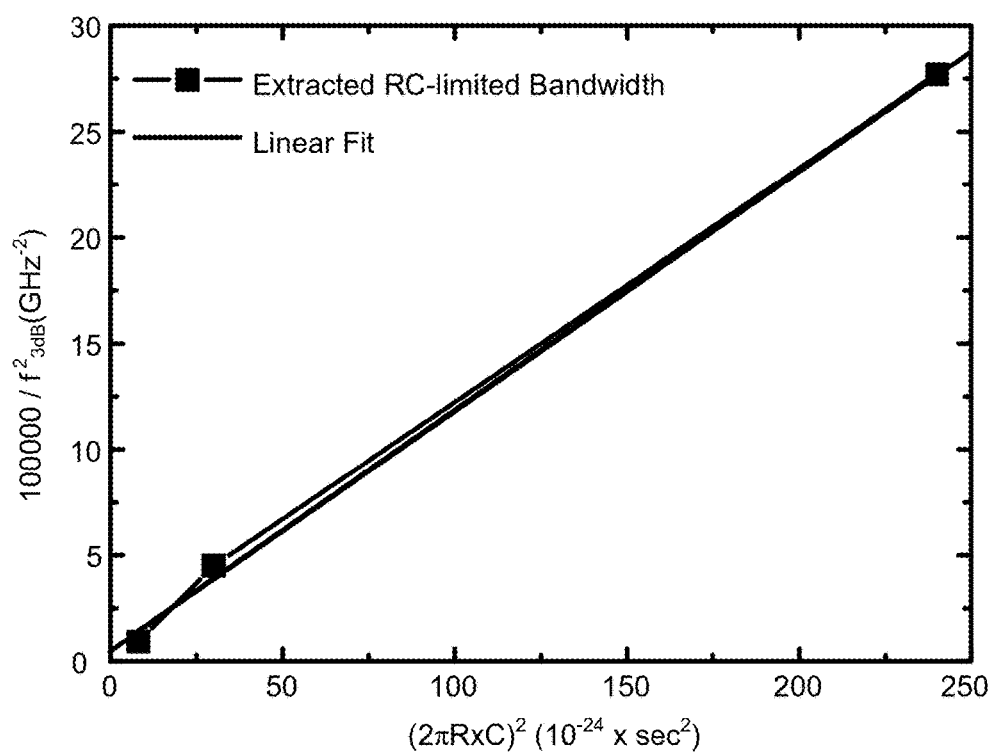
FIG. 5 is the view showing the extracted resistance-capacitance (RC) bandwidth.

FIG. 5 shows the $(2\pi RC)^2$ vs. $(10^5/f_{3\,dB}^2)$ values for the devices A to C with three different active diameters (3 μm, 5 μm and 8 μm). With Equation 1, the internal carrier transient time in the device is determined using the intercepts shown along the y-axis of FIG. 5, where $f_t$ thus obtained can be as high as 470 GHz.

Figure 6:
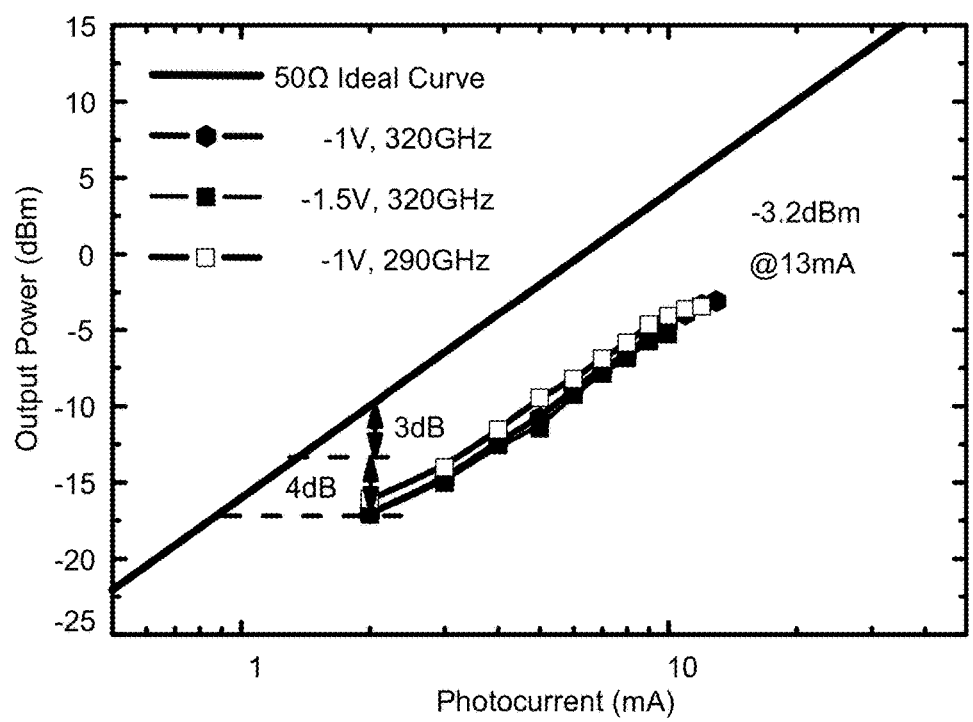
FIG. 6 is the view showing the measured photo-generated MMW powers under different reverse biases for the PD with the 3 µm active diameter.

FIG. 6 shows the measured photo-generated MMW power versus output photocurrent obtained under different reverse biases (−1V and −1.5V) though two-laser heterodyne-beating setup for the device A with the active diameter of 3 μm. The measurement frequency is chosen as the 3 dB O-E bandwidth at 320 GHz. An ideal relation between MMW power and averaged photocurrent (solid line) with a 100% optical modulation depth under a 50Ω load is also plotted for reference. It is clearly shown that the saturation current of the device A under −1V bias is around 13 mA and the corresponding maximum output power is around −3 dBm at an operating frequency of 0.32 THz. When the reverse bias voltage is further increased to −1.5V, the maximum output current is limited by thermal failure. In addition, there is a total 7 dB difference between the measured and ideal photo-generated THz power, under the same amount of output photocurrent, as shown in FIG. 6. The difference mainly arises from two factors. One is the nearly 3 dB high-frequency roll-off from the PD itself, when operated at around the 3 dB bandwidth (0.33 THz) frequency point. The other 4 dB loss originates from the optical modulation depth with the two-laser heterodyne-beating setup at the near THz frequency separation for being only around 63%.

Thus, the present invention proposes an ultrafast PD with high-power performance at THz regime. Through the narrow bandgap and the enhanced absorption process at the type-II interface between the $GaAs_{0.5}Sb_{0.5}$ and $In_{0.53}Ga_{0.47}As$ absorption layers, the incorporation of the type-II $P^+$-$GaAs_{0.5}Sb_{0.5}$/i-$In_{0.53}Ga_{0.47}As$ hybrid absorber in the InP UTC-PD leads to an improvement in responsivity. Moreover, current blocking effect as usually being one of the major factors limiting the output power of UTC-PD is minimized owing to the high-excess energy of the photo-generated electrons injected from the $GaAs_{0.5}Sb_{0.5}$ layer to the InP-based collector layer. The flip-chip bonding packaged device with an active diameter of 3 μm shows a moderate responsivity (0.11 amperes per watt (A/W)) along with a record wide 3 dB O-E bandwidth at 0.33 THz, among all the reported for long wavelength (1.3~1.55 μm) ultrafast PDs. A saturation current exceeding 13 mA and a continuous-wave (CW) output power as high as −3 dBm are successfully demonstrated at an operating frequency of 0.32 THz under an optical signal with a sinusoidal wave and a ~63% modulation depth for PD excitation.

To sum up, the present invention is a device of type-II hybrid absorber PD, where a type-II heterostructure of P-type partially depleted absorber (PDA) of $P^+$-$GaAs_{0.5}Sb_{0.5}$/i-$In_{0.53}Ga_{0.47}As$ is used with bandgap effectively narrowed to improve internal absorption process and responsivity performance; current blocking effect is minimized due to the high-excess energy of the photo-generated electrons injected from the $GaAs_{0.5}Sb_{0.5}$ layer; under a 50Ω load, a device with a moderate responsivity (0.11 A/W) obtains a record wide 3 dB O-E bandwidth and a 5 mA output photocurrent at 0.33 THz, among all the reported for long wavelength (1.3~1.55 μm) PDs; and, under an operating frequency of 0.32 THz, a CW output power as high as −3 dBm (13 mA saturation current) is successfully demonstrated under an optical signal with a sinusoidal wave and a ~63% modulation depth for PD excitation.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A device of type-II hybrid absorber photodetector (PD), comprising
   an N-type contact layer, said N-type contact layer being a first semiconductor being $N^+$-type doped;
   a collector layer, said collector layer being a second semiconductor being undoped, said collector layer being disposed on said N-type contact layer;
   a graded layer, said graded layer being a third semiconductor being N-type doped, said graded layer being disposed on said collector layer;
   a first absorption layer, said first absorption layer being a fourth semiconductor being undoped, said first absorption layer being disposed on said graded layer;
   a second absorption layer, said second absorption layer being a fifth semiconductor being $P^+$-type doped, said second absorption layer being disposed on said first absorption layer,
      wherein an interface with a narrow bandgap between said second absorption layer and said first absorption layer is obtained;
   an electron blocking layer, said electron blocking layer being a sixth semiconductor being $P^+$-type doped, said electron blocking layer being disposed on said second absorption layer; and
   a P-type graded field contact layer, said P-type graded field contact layer being a seventh semiconductor being $P^+$-type doped, said P-type graded field contact layer being disposed on said electron blocking layer,
   wherein the device is an epitaxial device;
   wherein said second absorption layer is a $P^+$-type absorption layer of gallium arsenic antimonide (GaAsSb) ($P^+$-$GaAs_{0.5}Sb_{0.5}$) being graded doped;
   wherein said first absorption layer is an intrinsic absorption layer of indium gallium arsenide (InGaAs) (i-$In_{0.53}Ga_{0.47}As$) being undoped;
   wherein a hybrid absorption layer of $P^+$-$GaAs_{0.5}Sb_{0.5}$/i-$In_{0.53}Ga_{0.47}As$ having a type-II band alignment are thus obtained in a uni-traveling-carrier photodiode (UTC-PD); and
   wherein, together with enhanced process of light absorption, responsivity is improved by said type-II interface with said narrow bandgap between said first absorption layer of $In_{0.53}Ga_{0.47}As$ and said second absorption layer of $GaAs_{0.5}Sb_{0.5}$.

2. The device according to claim 1, wherein said epitaxial device is grown on a semi-insulating semiconductor substrate.

3. The device according to claim 1, wherein the device further comprises a metallic conductive layer and said metallic conductive layer is disposed on said P-type graded field contact layer.

4. The device according to claim 1, wherein said N-type contact layer has a thickness of 700±20 nm.

5. The device according to claim 1, wherein said collector layer has a thickness of 100±20 nm.

6. The device according to claim 1, wherein said graded layer has a thickness of 20±2 nm.

7. The device according to claim 1, wherein said electron blocking layer has a thickness of 7±1 nm.

8. The device according to claim 1, wherein said P-type graded field contact layer has a thickness of 15±2 nm.

9. The device according to claim 1, wherein said N-type contact layer is $N^+$-type indium phosphide (InP); said collector layer is undoped InP; said graded layer is N-type indium aluminum gallium arsenide (InAlGaAs); said first absorption layer is undoped InGaAs; said second absorption layer is $P^+$-type GaAsSb; said electron blocking layer is $P^+$-type aluminum gallium arsenic antimonide (AlGaAsSb); and said P-type graded field contact layer is $P^+$-type InGaAs.

10. The device according to claim 9, wherein said graded layer is N$^-$-type In$_{0.52}$Al$_y$Ga$_{(0.48-y)}$As and y is a value of 0.04~0.25.

11. The device according to claim 9, wherein said electron blocking layer is P$^+$-type Al$_{0.3}$Ga$_{0.7}$As$_{0.5}$Sb$_{0.5}$.

12. The device according to claim 9, wherein said p-type graded field contact layer is P$^+$-type In$_{0.53}$Ga$_{0.47}$As.

\* \* \* \* \*